US006633646B1

(12) United States Patent
Hwang

(10) Patent No.: US 6,633,646 B1
(45) Date of Patent: Oct. 14, 2003

(54) METHOD AND APPARATUS FOR CONTROLLING EXHAUST NOISE

(75) Inventor: Yoha Hwang, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 338 days.

(21) Appl. No.: 09/604,084

(22) Filed: Jun. 27, 2000

(30) Foreign Application Priority Data

Jul. 7, 1999 (KR) ........................................ 1999-27372
Apr. 19, 2000 (KR) ........................................ 2000-20535

(51) Int. Cl.[7] ............................ H03B 29/00; F01N 7/08
(52) U.S. Cl. ...................... 381/71.5; 181/206; 181/227; 181/228
(58) Field of Search ............................... 381/71.4, 71.1, 381/71.5; 181/212, 213, 206, 227, 208, 224

(56) References Cited

U.S. PATENT DOCUMENTS

| | | | | |
|---|---|---|---|---|
| 4,315,558 A | * | 2/1982 | Katayama | 138/120 |
| 4,913,260 A | * | 4/1990 | Fallon | |
| 5,033,581 A | | 7/1991 | Feuling | |
| 5,060,271 A | * | 10/1991 | Geddes | 181/206 |

FOREIGN PATENT DOCUMENTS

| | | |
|---|---|---|
| DE | 43 41 951 | 6/1994 |
| EP | 0 329 165 | 8/1989 |
| FR | 997 880 | 1/1952 |
| FR | 56 165 | 9/1952 |
| JP | 01-100000 | 7/1989 |
| JP | 02-149813 | 12/1990 |
| JP | 05-96429 | 12/1993 |
| JP | 07-10437 | 2/1995 |
| KR | 9502473 | 3/1995 |

OTHER PUBLICATIONS

Patent Abstracts of Japan, vol. 1995, No. 07, Aug. 31, 1995, JP 07–091243, Apr. 4, 1995.
Patent Abstracts of Japan, vol. 1995, No. 03, Apr. 28, 1995, JP 06–348280, Dec. 22, 1994.

* cited by examiner

*Primary Examiner*—Forester W. Isen
*Assistant Examiner*—Brian Pendleton
(74) *Attorney, Agent, or Firm*—Oblon, Spivak, McClelland, Maier & Neustadt, P.C.

(57) ABSTRACT

The present invention relates to noise reduction technology for controlling exhaust noise in internal combustion engines such as an automobile engine and/or noise in a duct of an air delivery system such as air conditioning systems, and more particularly, to an apparatus and a method for controlling exhaust noise in an internal combustion engine or noise in a duct of an air delivery system using a conduit bypass pipe having variable or fixed lengths and dual mufflers.

19 Claims, 5 Drawing Sheets

METHOD AND APPARATUS FOR CONTROLLING EXHAUST NOISE

BACKGROUND OF INVENTION

1. Field of the Invention

The present invention relates to noise reduction technology for controlling exhaust noise in internal combustion engines and noise in ducts of air delivery systems, and more particularly, to an apparatus and method for controlling noise using bypass conduits or ducts and dual mufflers.

2. Description of the Prior Art

The most common method for controlling exhaust noise from an internal combustion engine is to use a muffler. For automobile engines, revolution speed varies greatly and the major frequency components of exhaust noise vary according to the revolution speed. It is thus very difficult to design a muffler so that it operates effectively over a wide range of revolution speeds. In general, conventional mufflers are designed so that exhaust gas passes through a complex pathway which essentially causes flow resistance for the exhaust gas, thereby increasing back pressure which hampers smooth exhaust of the gas from the engine and eventually lowers engine efficiency. In fact motorcyclists sometimes intentionally cut off the connection between the engine and the muffler to enjoy the resulting exorbitant noise and increased power of the engine. The problem is not an easy one to solve as reduction of exhaust noise has a direct correlation to increased back pressure and reduction in engine power.

Recent research on noise control involve studies on active control of exhaust noise to overcome the above-described disadvantages of passive noise control methods in an effort to increase engine efficiency and minimize back pressure. These active control studies have also been applied to noise reduction for ducts of air delivering systems such as air conditioners.

According to one example of a proposed active control system for exhaust noise, a noise measuring microphone is installed in an exhaust pipe. The noise registered on the microphone is transmitted to a controller which transmits an output signal via a control means to a speaker which is installed closer to an outlet than the microphone. Controlled noise, having the same magnitude as that of the original noise but at a phase opposite to that of the original noise, is generated through the speaker, and both of the original noise and the controlled noise are allowed to interfere with each other so that any emitted sound from the exhaust is reduced.

Although such active noise control methods might work in a laboratory, they have yet to be commercially applied to an actual vehicle because of the following problems which need to be solved.

(1) It is necessary to provide a speaker having very large output power for controlling large exhaust noise from a vehicle. Further, the size of the speaker must be increased to generate the required low frequency sound. Thus, it is difficult to manufacture a small and lightweight speaker having a high output power which are the requirements for installation onto areas where exhaust noise are generated on a vehicle. It is economically impractical to manufacture such a speaker.

(2) When applied to a vehicle, there is insufficient space for installing such a speaker which must have substantial size and weight. The lower structures of existing vehicles must be altered substanially and it is difficult to manufacture and maintain such a vehicle.

(3) Vehicular exhaust systems are connected by resilient members such as rubber rings to reduce vibration transmitted to the chassis. Attachment of a heavyweight speaker to an exhaust system will increase vibration due to extra weight and the exhaust system along with the speaker will deteriorate at a quicker rate.

(4) It will be extremely difficult to ensure durability of microphones and a speaker exposed to hot oxidizing exhaust gas.

(5) Controlled noise emitted from the speaker will flow backward up the tubing through diffraction and reflection, and will be measured together with the reference noise by the microphone positioned upstream of the exhaust pipe. Thus, the system will have to be very complex in design and expensive. Few automakers or consumers will be willing to pay for such non essentials.

Other solutions have been proposed including a method for actively controlling exhaust gas from an internal combustion engine or the duct of an air conduit, by using a bypass pipe such as shown in Korean Patent Publication No. 1995-2473 (FIG. 1). In such an apparatus, a U-shaped bypass pipe, the length of which can be varied, is attached to a main exhaust pipe. Such pipes are provided with a bypass region by which the main exhaust passage of the main pipe is bypassed and then the bypass passage through the bypass pipe is reintegrated with the main exhaust passage. The bypass region is comprised of a bypass pipe of variable length, composed of an outer and inner cylindrical portions which telescopically engage each other, and a fixed pipe of fixed length. The length of the bypass pipe can be changed by an actuator having an actuating rod which can be controlled by signals based on the noise collected from microphones.

With such a construction, the phase difference between the main noise components of the exhaust gas passing through the fixed pipe and the controlled noise components of the exhaust gas passing through the bypass pipe is adjusted 180 degrees. Consequently, the main noise components are eliminated by the controlled noise. In this case, the aforementioned problems can be avoided since the noise itself is used as a controlled noise without need of additional controlled noise sources such as a speaker However, the above method is capable of eliminating only the main noise component and their odd harmonics. Thus, it is impossible to control even harmonics of the main noise components generated from the engine together with eliminating their odd harmonics, and the method cannot provide a measure for controlling a broad band noise. In addition, when the engine operates at a low revolution such as in idling, the frequency of the main noise component is low, and its wavelength is large. In order to produce such a large phase difference between the noise having a large wavelength and the controlled noise, the length difference between the bypass pipe and the fixed pipe must be large. Consequently, the length of the bypass pipe is too long making its application for such purposes impractical.

OBJECTS OF THE INVENTION

Therefore, an object of the present invention is to solve the aforementioned problems, and to provide an apparatus and a method for controlling exhaust noise from an internal combustion engine by eliminating the main noise component of exhaust gas as well as their odd and even harmonics, which enhance engine efficiency by reducing back pressure of the exhaust gas, and eliminates broad band noise at high speed operation.

Another object of the invention is to provide an apparatus and a method for controlling noise in ducts of air conditioning systems which are capable of deleting the main noise component generated in the ducts as well as their odd and even harmonics.

SUMMARY OF THE INVENTION

The above objects can be accomplished by providing an active exhaust noise control apparatus comprising a main exhaust pipe, a first bypass pipe having a length which is variable and connected to said main exhaust pipe at both ends thereof so that a first bypass section is defined in the passage of the main exhaust pipe, a second bypass pipe having a length which is variable and connected to said main exhaust pipe at both ends thereof so that a second bypass section is defined in the passage of the main exhaust pipe, first and second actuators being actuated so as to vary the length of said first and second bypass pipes, respectively, and a controller for controlling said actuators. The active exhaust noise control apparatus of the present inventions may be provided with a lower back pressure muffler and a higher back pressure muffler bifurcated downstream of the main exhaust pipe, and a valve for selectively communicating the main exhaust pipe with the two mufflers, and wherein said valve is controlled by the controller.

The above objects can also be accomplished by providing a method of controlling exhaust noise in an engine by using the above apparatus, wherein at high speed operation of the engine, noise control is carried out by the steps of analyzing the main noise component C in the controller, removing the main noise component C and the noise components having frequencies of two times and odd time, such as three times or five times of the frequency of the main noise component by actuating the actuators and then adjusting the lengths of the bypass pipes, and smoothly discharging the exhaust gas by actuating the valve and thus passing the noise of the remaining wide range band through the low back pressure muffler, and when of starting the engine or driving at low speed, said noise control is carried out by actuating the valve and then passing the exhaust gas through the high back pressure muffler.

The above objects can also be accomplished by providing a noise control apparatus for controlling noise inside a duct of an air delivering system. Such apparatus is adapted for a main air delivering duct, and comprises a first bypass duct of which both ends are connected to said air delivering duct so that a first bypass section is defined in the passage of the air delivering duct, a second bypass duct of which both ends are connected to said main air delivering duct so that a second bypass section is defined in the passage of the main air delivering duct, the length of the first bypass duct is selected such that the lengths of the two air delivering passages passing through the two connection points of the main air delivering duct and the bypass duct differs from each other by a half wavelength of the main noise component occurring in the gas delivering system, and the length of the second bypass duct is selected so that the lengths of the two air delivering passages passing through the two connection points of the main air delivering duct and the bypass duct differs from each other by a half wavelength of components having a frequency of two times the frequency of the main noise component occurring in the air delivering system.

DETAILED DESCRIPTION OF THE INVENTION

The present invention will now be explained in greater detail.

(Embodiment 1)

Figure 2:
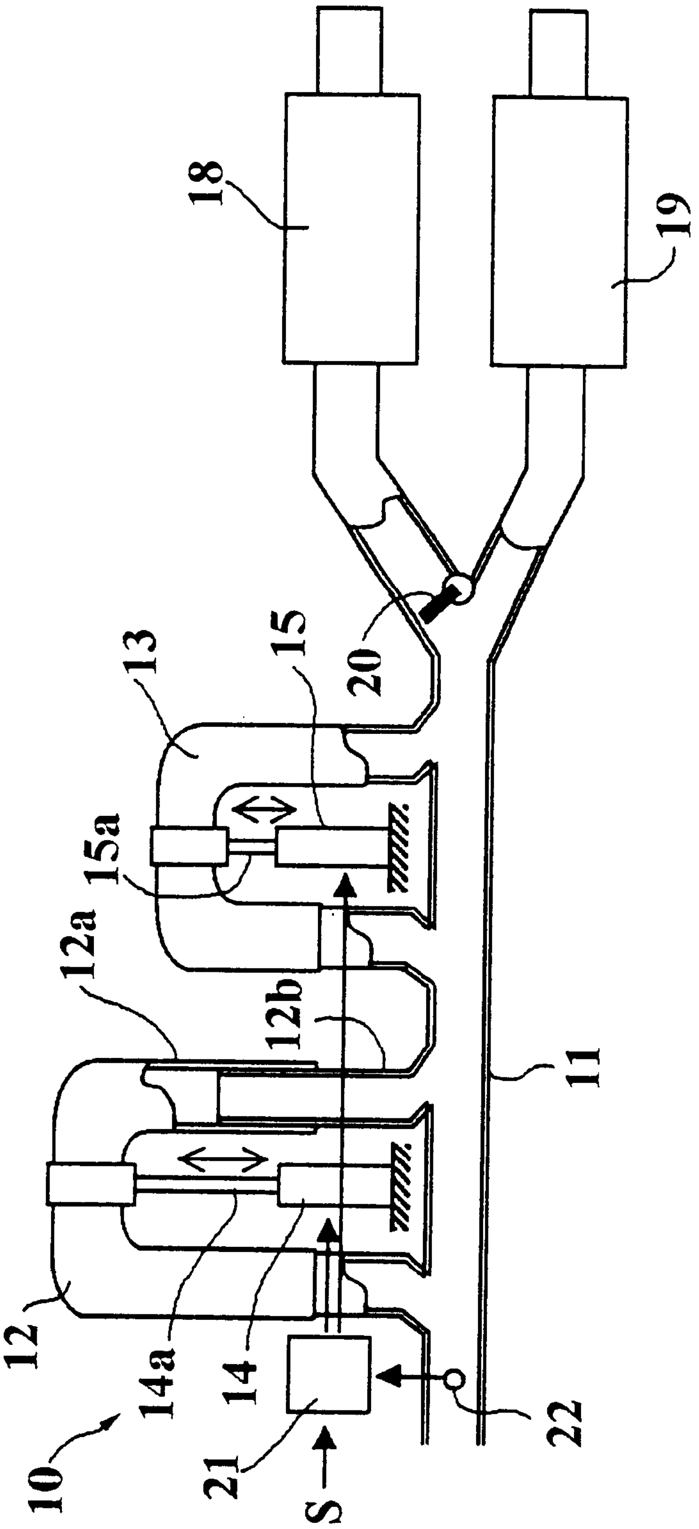
FIG. 2 is a front, partially cut-away view illustrating the first embodiment of the noise control apparatus according to the present invention for actively controlling exhaust noise in an internal combustion engine.

An active exhaust noise control apparatus 10 according to the first embodiment of the present invention for active control of exhaust noise in an internal combustion engine, is shown in FIG. 2. The exhaust noise active control apparatus 10 includes a main exhaust pipe 11, a first U-shaped bypass pipe 12 of which length is variable and opposite ends are connected to the main pipe 11 for defining a first bypass region within a passage of the main exhaust pipe 11, a second U-shaped bypass pipe 13 the length of which is variable and on which opposite ends are connected to the main exhaust pipe 11 for defining a second bypass region within a passage of the main pipe 11, first and second actuators 14 and 15 which respectively actuate the first and second bypass pipes 12 and 13, and a controller 21 for controlling the first and second actuators 14 and 15.

The first bypass pipe 12 comprises an outer cylindrical portion 12*a* and an inner cylindrical portion 12*b* which are telescopically engaged with each other. The second bypass pipe 13 comprise an outer cylindrical portion 13*a* and an inner cylindrical portion 13*b* which are telescopically engaged with each other. Thus, the lengths of the bypass pipes are changed by a length change of actuating rods 14*a* and 15*a* of the actuators 14 and 15 that are driven according to a control signal from the controller 21. Bellows-typed bypass pipes, the length of which can be easily changed, may be used instead of the telescopic type. The first and second bypass pipes 12 and 13 have a single outer portion and a single inner portion, respectively, but a telescopic bypass pipe, which has a plurality of outer and inner portions telescopically engaged with each other, may be used.

By way of example, muffler 19 is a conventional high back pressure muffler and muffler 18 is a low back pressure muffler having a simple inner structure. Instead of mufflers 18 and 19, a dual mode muffler which is capable of changing exhaust gas passages may also be used. That is, the dual mode muffler can operate as a general high back pressure muffler for normal driving conditions, and as a low back pressure muffler having low back pressure in a control. When the dual mode muffler is used, valve 20 is not required but the dual mode muffler is controlled by the controller 21 such that it can be selectively actuated as a general high back pressure muffler or a low back pressure muffler by change of the exhaust gas passage inside the muffler. In addition, the dual mode muffler can be automatically switched such that the muffler selectively acts as a general high back pressure muffler or a low back pressure muffler.

The controller 21 receives and analyzes signals S from an engine control unit (ECU) or accelerometer which is installed on the engine, or signals from microphone 22 which is installed into the exhaust pipe 11, and the like. The controller 21 calculates a main component of the engine noise, and then adjusts the length of each of the variable bypass pipes 12 and 13 by actuating the actuators 14 and 15 such as embodied by pneumatic cylinders.

The active exhaust noise control apparatus 10 of the first embodiment of the present invention, as constructed as above, will be more fully described. Exhaust noise is caused by explosions in an engine and comprises a variety of noise components. However, the frequency of the main noise component C is mainly in proportion to the engine revolution per minute (RPM). For example, when a gasoline engine of 4 strokes, 4 cylinders rotates at 900 RPM (i.e. 15 revolutions per second), the frequency of the main noise component C is 30 Hz, as there are two explosions per revolution. Therefore, the majority of the noise components comprise mainly the main noise component C, which has a frequency of two times the engine RPM, and noise components with harmonics having frequency proportional by integers. In other words, the majority of the noise components depend on the engine RPM. Based on experiments, for an engine with 4 cylinders, the majority of the noise components comprise component C2 having a frequency of two times the engine RPM and component C4 having frequency of four times the engine RPM. The balance between component C2 having the frequency of two times the engine RPM and component C4 having the frequency of four times the engine RPM depends on loads and the engine RPM.

First, when starting the engine, when abruptly changing the engine RPM from idling, depressing the accelerator pedal while in neutral position, abnormal driving at high speed, or urban driving at low speed, the exhaust gas is allowed to flow in conventional muffler 19 by using valve 20 at the inlet of the muffler. Thus, the exhaust gas and noise pass through the conventional exhaust system. In other words, active control of noise is not effected. In this case, the efficiency of the engine is not increased.

In normal driving at high speed, the signals S from the accelerometer or the electronic control unit (ECU) mounted in the engine or the signals from the microphone 22 mounted on the exhaust pipe 11, and the like, are transferred to and analyzed in the controller 21, and thus, the main noise component C is calculated. In case of a gasoline engine of 4 strokes and 4 cylinders, the main noise component C is the component C2 having a frequency of two times the engine RPM. In case of a gasoline engine of 4 strokes, 6 cylinders, the main noise component C is the component having a frequency of three times the engine RPM. After the main noise component C is calculated, the length of the bypass pipe 12 is adjusted by operating the actuator 14 (such as a pneumatic cylinder) so that the difference between the length of exhaust passage of the main exhaust pipe 11 and that of the bypass passage of the bypass pipe 12 through which the exhaust gas and noise passes is a half the wave length of the main noise component C. For a gasoline engine of 4 strokes, 4 cylinders, the component C2 having the frequency of two times the engine RPM, which is the main noise component C, and the noise components having the frequencies in odd number increments such as three times or five times of the engine RPM, are eliminated at the joining portion of the main exhaust pipe 11 and the bypass pipe 12. In addition, the noise component having a frequency of two times the frequency of the component C2, which is two times the engine RPM, is eliminated from controlled noise by adjusting the length of the bypass pipe 13 by operating an actuator 15. The actuator 15 is operated together with or separately with the actuator 14. The exhaust gas is allowed to pass through the low exhaust pressure muffler 18, which is of simple structure, and is smoothly blown out by operating the valve 20. Thus, the remaining noises of other wide frequencies are controlled. At this stage, if a dual mode muffler is used, it operates as a low back pressure muffler with little back pressure by changing the duct passages. Such active control reduces back pressure and the efficiency of the engine is increased.

In the above-mentioned system, the range for changing the length of the bypass pipe is limited, and thus, the controllable engine RPM range is limited. For example, for an engine of 4 strokes, 4 cylinder, if the first bypass pipe 12 is designed to control the component C2 having the frequency of two times the engine RPM (which is the main noise component in the engine operated in the range of 2,000 to 4,000 RPM), the first bypass pipe 12 controls noise of about 67 to 133 Hz, and the second bypass pipe 13 controls noise of about 133 to 267 Hz. Thus, with this system, noise in the engine operated with 4,000 RPM or above, is not controlled. However, even for engine operation at 4,000 RPM or above, if there are little component C4 having the frequency of four times engine RPM, the controllable range of engine RPM is enhanced two-fold, i.e. 8,000 RPM by controlling the component C2 having the frequency of two times engine RPM in the second bypass pipe 13. After the component C2 having the frequency of two times the engine RPM, which is the main noise component C, is calculated, the length of the second bypass pipe 13 is adjusted by operating the actuator 15 so that the difference between the lengths of two passages of the main exhaust pipe 11 and the second bypass pipe 13 through which the exhaust gas and noise pass is a half of the wave length of the component C2 of two times the engine RPM, which is the main noise component C. Thus, the component C2 having a frequency of two times the engine RPM, which is the main noise component C, and noise components having a frequency in odd integer increments, such as three times or five times the frequency of the component C2, are eliminated at the joining portion of the main exhaust pipe 11 and the bypass pipe 13. The exhaust gas is allowed to pass through the low exhaust pressure muffler 18 and is smoothly blown out by operating the valve 20. Thus, the remaining noises of other wide frequencies are controlled. If the dual mode muffler is used, it is operated as a low exhaust pressure muffler with less back pressure by changing the passages therein.

The exhaust noise active control apparatus 10 of the present embodiment may also be adapted to a device for reducing noise generated inside a duct of a transfer system such as in a building air conditioning system. In other words, if mufflers 18 and 19 are eliminated from the exhaust noise active control apparatus 10, the main exhaust pipe 11 and the first and second bypass pipes 12 and 13 are constructed as a main air transfer duct and two bypass ducts, respectively, and if an actuator for operating each bypass duct and controller for controlling the actuator are provided, the exhaust noise active control apparatus 10 may be adapted to a noise eliminating device in the inside of the duct of an air conditioner.

In the above described embodiment, the main exhaust pipe 11 is provided with only two bypass pipes 12 and 13. However, three or more bypass pipes may be provided, if desired. When three or more bypass pipes are provided and if the engine RPM is too high to eliminate the component C2 having the frequency two times the engine RPM, the component C2 and components having the frequencies in odd number increments such as three or five times are eliminated in the second bypass pipe, and components having frequency two times that of the component C2 are eliminated in the third bypass pipe.

(Embodiment 2)

Figure 3:
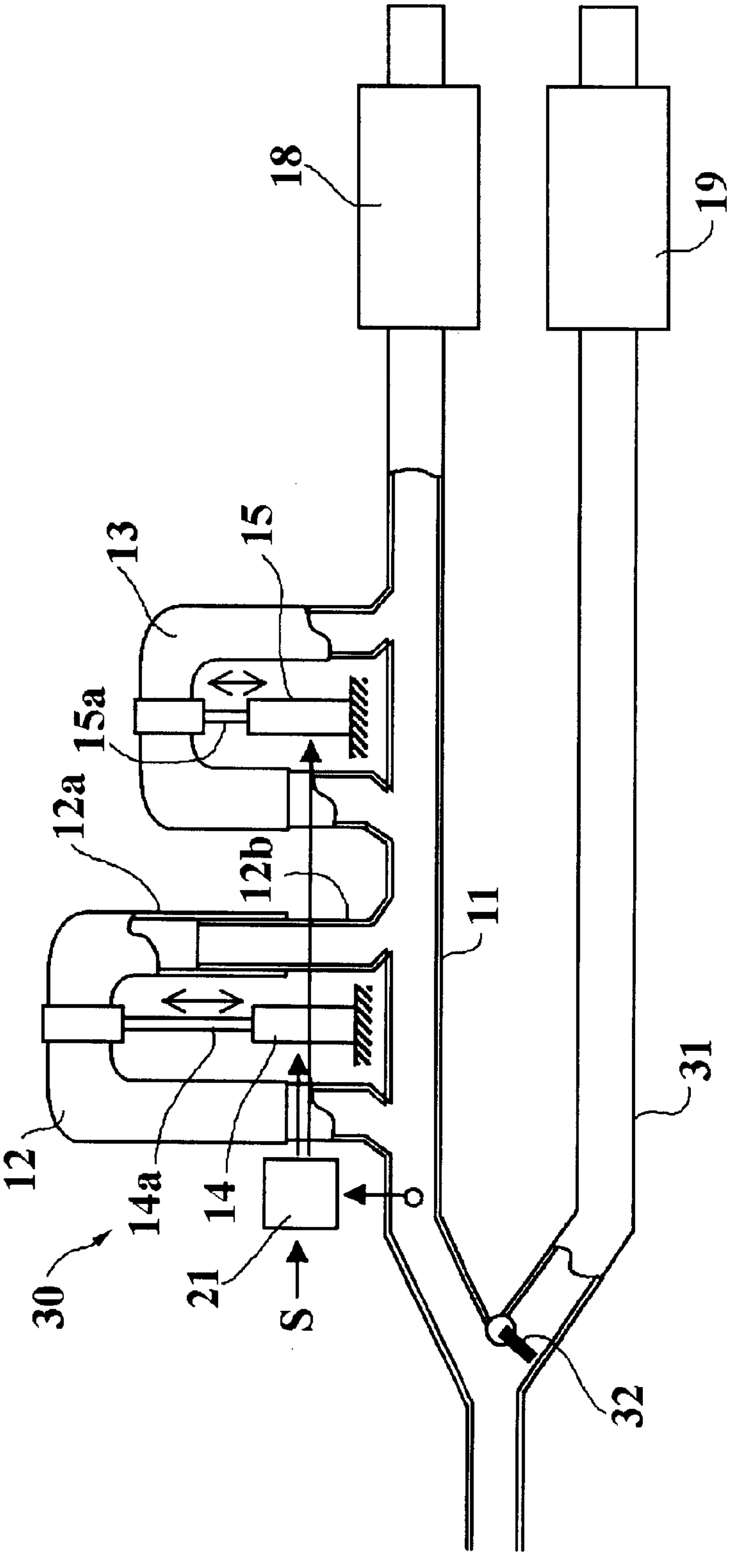
FIG. 3 is a front, partially cut-away view illustrating the second embodiment of the noise control apparatus according to the present invention for actively controlling exhaust noise from an internal combustion engine.

An exhaust noise active control apparatus 30 according to the second embodiment of the present invention is shown in FIG. 3. The basic construction and operation of the active exhaust noise control apparatus 30 according to the second embodiment are the same as those of the active control apparatus 10 according to the first embodiment, except that it comprises a main exhaust pipe 11 and a second exhaust pipe 31 branches therefrom, and provided with a valve 21 selectively communicating two exhaust passages formed by the main exhaust pipe 11 and the second exhaust pipe 31 and a low back pressure muffler 18 installed at a lower flow of the main exhaust pipe 11 and a conventional high back pressure muffler 19 installed downstream of the second exhaust pipe 31.

With the above construction, when starting the engine or driving at low speed, the exhaust gas is allowed to flow through the second exhaust pipe 31 and the conventional muffler 19 by actuating the valve 32. Thus, the exhaust gas and noise pass through the conventional exhaust system. In other words, active control of noise is not effected. In this case, the efficiency of engine is not increased.

When driving at high speed, the exhaust gas is allowed to flow through the main exhaust pipe 11 by actuating the valve 32. In order to control noise flowing into the main exhaust pipe 11, the main noise component C is analyzed and calculated in controller 21, and then, the actuators 14 and 15 are operated. Thereby, the main noise component C and noise components having the frequency of three and five times the frequency of the main noise component C are controlled by the first bypass pipe 12, and noise components having a frequency of two times of the frequency of the main noise component C are also controlled by the second bypass pipe 13.

Also, if there is little component C4 having the frequency of four times the engine RPM during high speed operation (as in the first embodiment), the component C2 having a frequency two times the engine RPM and noise components having frequencies in odd number increments, such as three or five times the frequency of the component C2, can be eliminated by adjusting the length of the second bypass pipe 13. In this case, the back pressure is reduced and the efficiency of engine is increased. This example describes a main exhaust pipe 11 provided with only two bypass piped 12 and 13. However, three or more bypass pipes may be provided, if desired.

(Embodiment 3)

Figure 4:
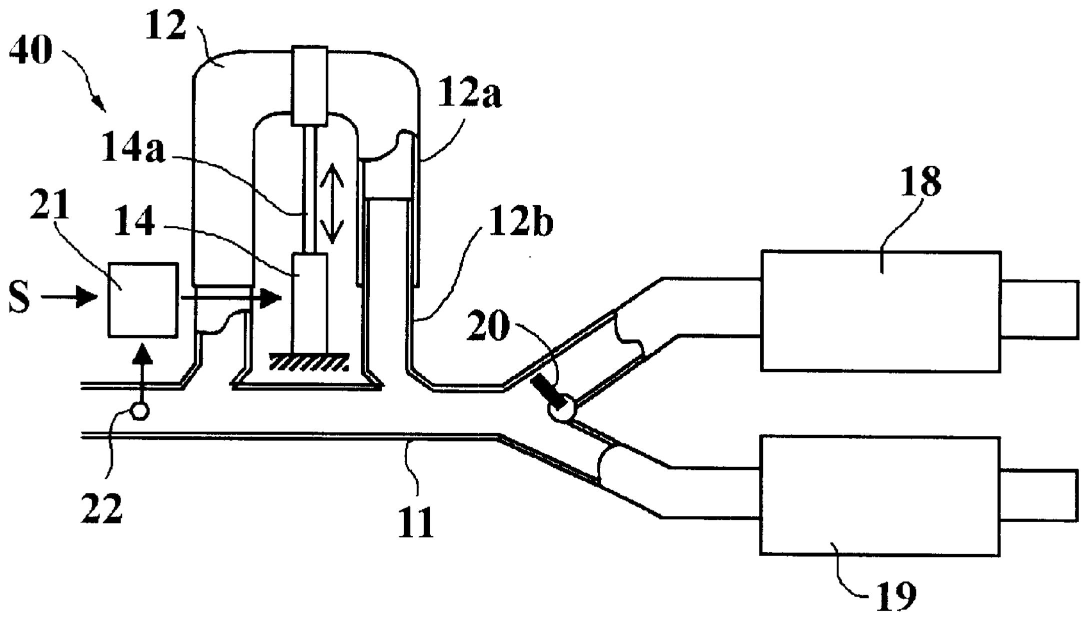
FIG. 4 is a front, partially cut-away view depicting a third embodiment of the noise control apparatus according to the present invention for actively controlling exhaust noise in an internal combustion engine.

An active exhaust noise control apparatus 40 according to the third embodiment of the present invention is shown in FIG. 4. The exhaust noise active control apparatus 40 according to the third embodiment of the present invention has a main exhaust pipe 11 and a U-shaped length-variable bypass pipe 12 connected to the main exhaust pipe 11 so that a single bypass region is created in the passage through the main exhaust pipe 11. Exhaust noise active control apparatus 40 has two mufflers 18 and 19 bifurcated downstream of the main exhaust pipe 11, and a valve 20 selectively communicating two mufflers 18 and 19 with the main exhaust pipe 11.

Figure 1:
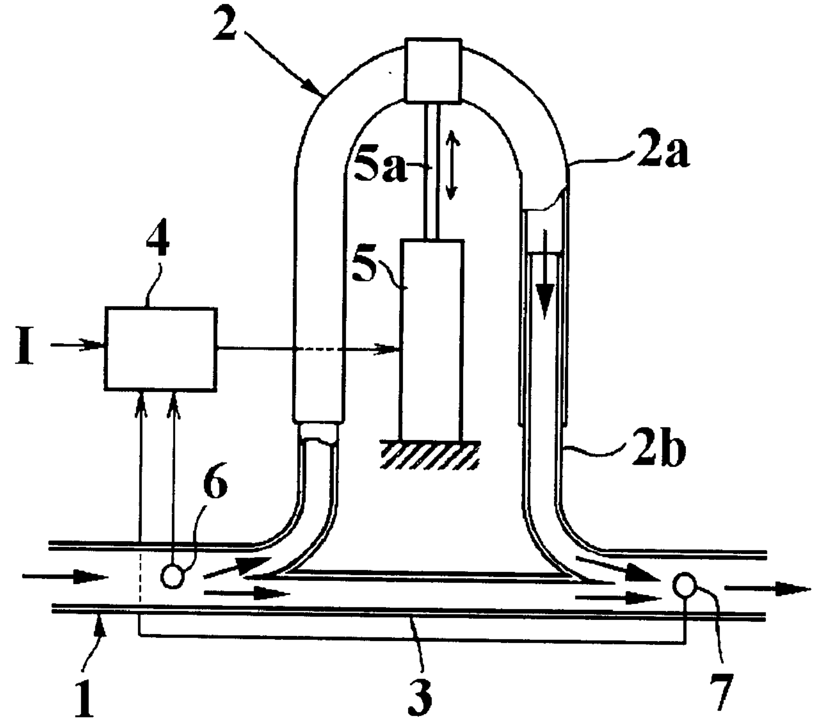
FIG. 1 is a front, partially cut-away view of a known noise control apparatus for actively controlling exhaust noise in an internal combustion engine.

In this, when starting the engine or driving at low speed, the exhaust gas is allowed to flow through the conventional muffler 19 by using the valve 20 in an inlet of the muffler. Thus, the exhaust gas and noise pass through the conventional exhaust system. In other words, active control of noise is not effected. In this case, the efficiency of engine is not increased. On the contrary, in the same manner as the prior art shown in FIG. 1, the component C2 having the frequency of two times the engine RPM and noise components having the frequencies in odd number increments such as three times or five times the frequency of the component C2, are eliminated by actuating the actuator 14 and adjusting the length of the bypass pipe 12.

This embodiment is practical if there is a little component C4 having a frequency four times the engine RPM according to the characteristics of the engine. And, the noise can be reduced by simply providing two mufflers 18 and 19 branched off downstream of the main exhaust pipe 11 and a valve 20, which selectively communicates the main exhaust pipe 11 and two mufflers 18 and 19 with the main exhaust pipe 11. In this case, the dual mode muffler may also be used.

(Embodiment 4)

Figure 5:
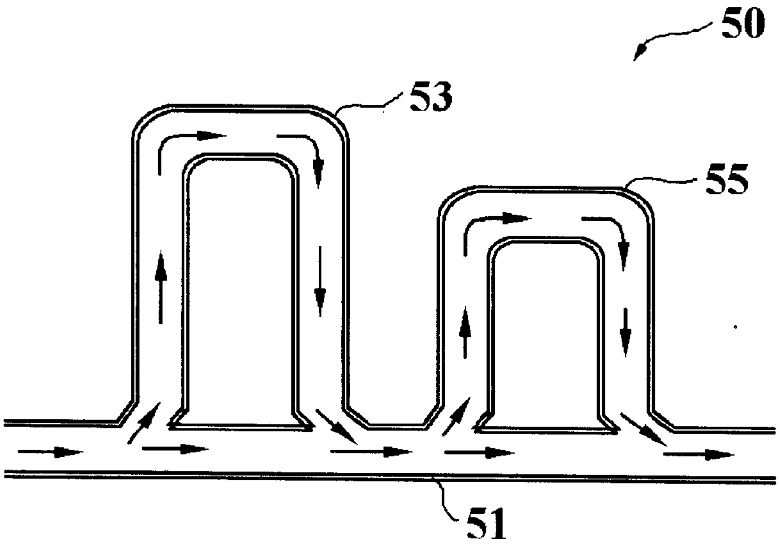
FIG. 5 is a front, partially cut-away illustration of the fourth embodiment of the noise control apparatus according to the present invention for actively controlling noise in a duct of an air delivering system.

The noise control apparatus 50 according to a fourth embodiment of the present invention for controlling noise in a duct of an air delivering system such as an air conditioning system in a building is shown in FIG. 5. In this embodiment, a "U" shaped, first and second bypass ducts 53 and 55 are provided in a main air delivering duct 51, and the length of the bypass ducts 53 and 55 are fixed and not variable, which is different from the first embodiment of the present invention. Also, in this embodiment, the actuators 14 and 15, two muffler 18 and 19, the valve 20 and the controller 21 are not employed. The reason for this is that the scale of the air delivery system such as those with fan delivered air conditioning air to the main duct 51, is almost constant in the building air conditioning systems, and consequently, the main noise component produced in such systems are also substantially constant. The main noise component produced in such air delivery systems can be measured and/or calculated during the design and manufacture stage. The length of the first bypass duct 53 is selected so that the difference between lengths of the air delivery passages through main air delivering duct 51 and the bypass ducts 53 at their connected portions, is the same as half the wavelength of the main noise. In this way, the main noise component and noise components having frequency in odd increments (3 or 5 times the frequency of the main noise components) are eliminated by the "U" shaped first bypass duct 53. Also, by properly selecting the length of the second bypass duct 55, noise component having the frequency of two times the frequency of the main noise component can be eliminated. The length of the second bypass duct 55 is selected so that the length difference between the air delivery passages along main air delivering duct 51 and the second bypass ducts 55 at their connected portions, is the same as half the wave length of nose component having a frequency two times the frequency of the main noise component.

Thus, it is possible to provide a noise control apparatus, which requires no additional costs in terms of additional devices, complex maintenance and frequent repair, by simply providing a bypass duct at the main air delivery duct. Although this embodiment has been described with main air delivery duct 51 provided with only two bypass ducts 53 and 55, one skilled in the art will appreciate that more than two, and in fact, a plurality of bypass ducts may be provided depending on the need.

Figure 6:
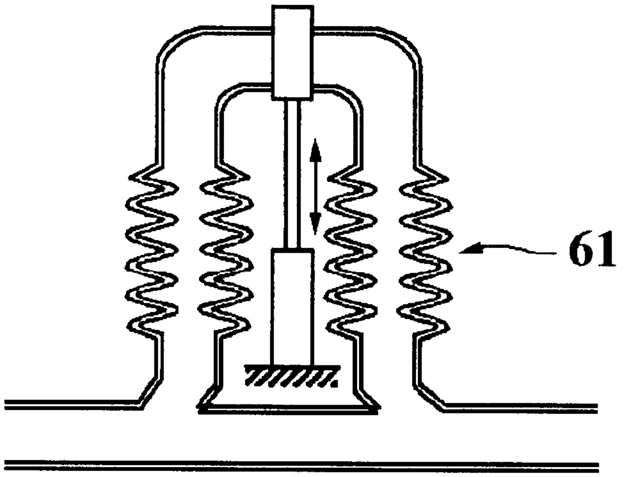
FIGS. 6 and 7 are sectional views illustrating examples of a bellows-type bypass pipe and a multi-step telescopic bypass pipe, respectively.
Figure 7:
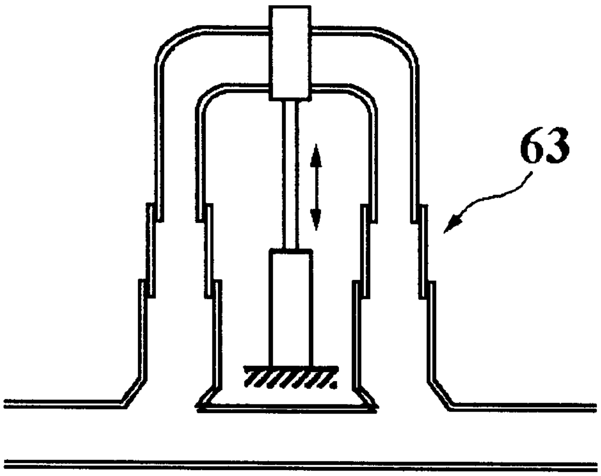

FIG. 6 and FIG. 7 show examples of the bellows-type (non-telescopic type) bypass pipe 61 and an antenna-type bypass pipe 63, respectively. Although not shown in FIGS. 6 and 7, the bellows-type bypass pipe 61 and the multi-step telescopic type (or the antenna type) bypass pipe 63 can be constructed with variable lengths by variations of the lengths of actuating rods 14*a* and 15*a* of actuators 14 and 15 which are actuated by control signals from a controller (as in the telescopic bypass pipes 12 and 13 described previously). The ratio of the maximum length and minimum length of the telescopic bypass pipes 12 and 13 is about 2:1. In contrast, the ratios for bellows type pipe 61 and the multi-step telescopic type bypass pipe 63 can be changed to 3:1, 4:1 or more. Thus, the controllable range of noise according to the engine running speed can also be widened.

As described above, by constructing a system using the length-variable bypass pipes, the main noise component of the exhaust gas as well as their odd and even harmonics in low frequency bands can be controlled, and noise in wider low frequency bands can be reduced according to the reduction effect of circumferential noise. Also, the noise level of the noises at wide range in a mid-high band are somewhat low and their wavelengths are short. Such noise is easily eliminated. Therefore, it is possible to use a muffler comprising linear pipes and noise absorption material as only noises at a wide range in mid-high bands are eliminated by a low back-pressure muffler positioned downstream of the pipe.

Also, as described above, the present invention is used as an active control method for high speed running, and conventional passive control method for engine starting and low speed running. If there is little component C4 having the frequency of four times the engine RPM according to the characteristics of the engine, the drawbacks of the prior art are eliminated with the present invention by actively controlling the RPM range only frequently used in actual running and not throughout the full-running range of the engine, For example, the engine of a vehicle frequently driven on the freeway is driven at high speed most of the time. Such engines can be controlled with a conventional exhaust system during cold engine starts or while driving on local roads, and active controlled as described in the present invention during high speed engine running. This will produce optimum engine power and fuel savings for the automobile.

One skilled in the art will appreciate that the several embodiments of the present invention described herein may be modified or adapted to other specific forms after having the benefit of this disclosure and without departing from the spirit and scope of the present invention. The examples and embodiments described herein should therefore be considered in all respects as merely illustrative and the invention is not to be limited to the details given.

What is claimed is:

1. An apparatus for controlling exhaust noise from an internal combustion engine, comprising:

a main exhaust pipe;

a first bypass pipe having a length which is variable and connected to said main exhaust pipe at both ends thereof so that a first bypass section is defined in the passage of said main exhaust pipe, and two air delivering passages each passing through each of the two connection points for said main exhaust pipe and the first bypass pipe are formed thereby;

a second bypass pipe having a length which is variable and connected to said main exhaust pipe at both ends thereof so that a second bypass section is defined in the passage of said main exhaust pipe, and two air delivering passages each passing through each of the two connection points for said main exhaust pipe and the second bypass pipe are formed thereby;

first and second actuators adapted to be actuated to vary the length of said first and second bypass pipes, respectively;

a controller for controlling said first actuator to select the length of said first bypass pipe so that the lengths of said two air delivering passages passing through said two connection points of said main exhaust pipe and said first bypass pipe differ from each other by a half wavelength of a main noise component occurring in said internal combustion engine, and for controlling said second actuator to select the length of said second bypass pipe so that the lengths of said two air delivering passages passing through said two connection points of said main exhaust pipe and said second bypass pipe differ from each other by a half wavelength of a noise component having a frequency of two times the frequency of the main noise component occurring in said internal combustion engine;

a lower back pressure muffler installed downstream of said main exhaust pipe; and a higher back pressure muffler provided separately from said lower back pressure muffler; such that when the engine revolutions per minute are higher than a predetermined value, said main noise component and said noise component having a frequency of two times the frequency of said main noise component are eliminated at said two connection points of each of said main exhaust pipe and said first and second bypass pipes, and the remaining noises of other wide frequencies pass through said lower back pressure muffler, and when the engine revolution per minute is lower than the predetermined value, the exhaust noise passes through the higher back pressure muffler.

2. The apparatus according to claim 1, wherein said lower back pressure muffler and said higher back pressure muffler are bifurcated downstream of said main exhaust pipe, and said apparatus further comprises a valve which is controlled by said controller for selectively communicating said main exhaust pipe with said mufflers and wherein the valve is disposed in said main exhaust pipe.

3. The apparatus according to claim 1, wherein said lower back pressure muffler and said higher back pressure muffler are implemented as a dual mode type muffler which is installed downstream of said main exhaust pipe and is controlled by said controller and selectively actuated to function as one of a higher back pressure muffler and a lower back pressure muffler.

4. The apparatus according to claim 1, wherein said lower back pressure muffler and said higher back pressure muffler are implemented as a dual mode type muffler which is installed downstream of said main exhaust pipe and is selectively actuated as a higher back pressure muffler or a lower back pressure muffler in accordance with the exhaust gas pressure.

5. The apparatus according to claim 1, wherein said apparatus further comprises a second exhaust pipe bifurcated upstream of said first bypass pipe from said main exhaust pipe, and a valve which is controlled by said controller for selectively communicating two exhaust gas passages defined by said main exhaust pipe and the second exhaust pipe, the valve being disposed between said main exhaust pipe and the second exhaust pipe, and wherein said lower back pressure muffler is installed downstream of said main exhaust pipe, and said higher back pressure muffler is installed downstream of the second exhaust pipe.

6. The apparatus according to any one of claims 1 to 5, wherein each of said first and second bypass pipes comprise U-shaped outer cylindrical body and inner cylindrical body, which are telescopically connected to each other, and the length of each said bypass pipes is adapted to be varied by variations in lengths of actuating rods of said actuators which are actuated by a control signal from said controller.

7. The apparatus according to any one of claims 1 to 5, wherein said first and second bypass pipes comprise bellows type bypass pipes, and the length of each said bypass pipes is adapted to be varied by variations in lengths of actuating rods of each said actuators which are actuated by a control signal from said controller.

8. The apparatus according to any one of claims 1 to 5, wherein said first and second bypass pipes comprise multi-step telescopic type bypass pipes, and the length of each said bypass pipes is adapted to be varied by variations in lengths of actuating rods of each said actuators which are actuated by a control signal from said controller.

9. An active exhaust noise control apparatus, comprising:

a main exhaust pipe 11, a bypass pipe 12 having variable length and connected to said main exhaust pipe 11 at both ends thereof so that a bypass section is defined in the passage of the main exhaust pipe 11, an actuator 14 being actuated so as to vary the length of said bypass pipe 12 by varying the length of the actuating rod 14*a*, and a controller 21 for controlling said actuator 14, said apparatus further comprises a lower back pressure muffler 18 and a higher back pressure muffler 19 which are bifurcated and installed downstream of the main exhaust pipe 11, and a valve 20 for selectively communicating the main exhaust pipe 11 with two mufflers 18 and 19, and said valve 20 is controlled by said controller 21.

10. A noise control apparatus for controlling noise inside a duct of an air delivering system, comprising:

a main air delivering duct 15, a first bypass duct 53 of which both ends are connected to said air delivering duct 51 so that a first bypass section is defined in the passage of the air delivering duct 51, a second bypass duct 55 of which both ends are connected to said main air delivering duct 51 so that a second bypass section is defined in the passage of the main air delivering duct 51, wherein the length of the first bypass duct 53 is selected so that the lengths of the two air delivering passages passing through the two connection points of the main air delivering duct 51 and the bypass duct 53 differs from each other by a half wavelength of the main noise component occurring in the gas delivering system, and wherein the length of the second bypass duct 55 is selected so that the lengths of the two air delivering passages passing through the two connection points of the main air delivering duct 51 and the bypass duct 55 differs from each other by a half wavelength of component having a frequency of two times the frequency of the main noise components occurring in the air delivering system.

11. A method for controlling exhaust noise from an internal combustion engine, comprising the steps of:

analyzing a main noise component passing through a main exhaust pipe with a controller;

actuating a first actuator with said controller to select a length of a first bypass pipe such that the lengths of two air delivering passages each passing through one of two connection points of said main exhaust pipe with the first bypass pipe differ from each other by a half wavelength of said main noise component to eliminate said main noise component and noise components having frequencies multiplied by odd integers to the frequency of said main noise component;

actuating a second actuator with said controller to select a length of a second bypass pipe such that the lengths of two air delivering passages each passing through one of two connection points of said main exhaust pipe with the second bypass pipe differ from each other by a half wavelength of a noise component having a frequency of two times the frequency of said main noise component to eliminate the noise component having a frequency of two times the frequency of said main noise component; and controlling a valve with said controller to communicate said main exhaust pipe with a lower back pressure muffler at an engine rotation speed higher than a predetermined value so that remaining noises of other wide frequencies pass through the lower back pressure muffler, and to communicate said main exhaust pipe with a higher back pressure muffler at one of an engine rotation speed lower than a predetermined value and upon cold starting said engine so that the exhaust noise passes through the higher back pressure muffler.

12. A method for controlling exhaust noise from an internal combustion engine, comprising the steps of:

analyzing a main noise component passing through a main exhaust pipe with a controller;

actuating a first actuator with said controller to select a length of a first bypass pipe such that the lengths of two air delivering passages each passing through one of two connection points of said main exhaust pipe with the first bypass pipe differ from each other by a half wavelength of said main noise component to eliminate said main noise component and noise components having frequencies multiplied by odd integers to the frequency of said main noise component;

actuating a second actuator with said controller to select a length of a second bypass pipe such that the lengths of two air delivering passages each passing through one of two connection points of said main exhaust pipe with the second bypass pipe differ from each other by a half wavelength of a noise component having a frequency of two times the frequency of said main noise component to eliminate the noise component having a frequency of two times the frequency of said main noise component; and actuating a dual mode muffler to operate as a lower back pressure muffler at an engine rotation speed higher than a predetermined value, and as a higher back pressure muffler at one of an engine rotation speed lower than a predetermined value and upon cold starting said engine.

13. A method for controlling exhaust noise from an internal combustion engine, comprising the steps of:

actuating a valve at an engine rotation speed higher than a predetermined value such that exhaust noise passes through a main exhaust pipe, and at an engine rotation speed lower than a predetermined value or cold starting said engine such that exhaust noise passes through a second exhaust pipe and a higher back pressure muffler;

analyzing a main noise component passing through the main exhaust pipe with a controller;

actuating a first actuator with said controller to select a length of a first bypass pipe such that the lengths of two air delivering passages each passing through one of two connection points of said main exhaust pipe with the first bypass pipe differ from each other by a half wavelength of said main noise component to eliminate said main noise component and noise components having frequencies multiplied by odd integers to the frequency of said main noise component;

actuating a second actuator with said controller to select a length of a second bypass pipe such that the lengths of two air delivering passages each passing through one of two connection points of said main exhaust pipe with the second bypass pipe differ from each other by a half wavelength of a noise component having a frequency of two times the frequency of said main noise component to eliminate the noise component having a frequency of two times the frequency of said main noise component; and passing remaining noises of other wide frequencies through a lower back pressure muffler.

14. The method according to any one of claims 11, 12, and 13, wherein said method further comprises the step of controlling said main noise component with said second bypass pipe when engine rotation speed is increased and the length of said first bypass pipe is reduced to a minimum length thereof.

15. A method for controlling exhaust noise from an internal combustion engine, comprising the steps of:

analyzing a main noise component with a controller;

actuating an actuator with said controller to adjust a length of a bypass pipe such that said main noise component and noise components having frequencies of two times the frequency of said main noise component or multiplied by odd integers to the frequency of said main noise component, are removed; and controlling a valve with said controller to communicate a main exhaust pipe with a lower back pressure muffler at an engine rotation speed higher than a predetermined value such that remaining noises of other wide frequencies pass through the lower back pressure muffler, and to communicate the main exhaust pipe with a higher back pressure muffler at an engine rotation speed lower than a predetermined value or cold starting said engine such that exhaust noise passes through the higher back pressure muffler.

16. An apparatus for controlling exhaust noise from an internal combustion engine, comprising:

a main exhaust pipe;

a first bypass pipe having a length which is variable and connected to said main exhaust pipe at both ends thereof so that a first bypass section is defined in a passage of said main exhaust pipe, and two air delivering passages each passing through each of the two connection points for said main exhaust pipe and the first bypass pipe are formed thereby;

a second bypass pipe having a length which is variable and connected to said main exhaust pipe at both ends thereof so that a second bypass section is defined in the passage of said main exhaust pipe;

a first and second actuators adapted to be actuated to vary the length of said first and second bypass pipes, respectively; and a controller for controlling said first actuators wherein said apparatus further comprises a lower back pressure muffler and a higher back pressure muffler bifurcated downstream of the main exhaust pipe, and a valve for selectively communicating the main exhaust pipe with the two mufflers and, and wherein said valve is controlled by the controller.

17. An apparatus for controlling exhaust noise from an internal combustion engine, comprising:

a main exhaust pipe;

a first bypass pipe having a length which is variable and connected to said main exhaust pipe at both ends thereof so that a first bypass section is defined in the passage of said main exhaust pipe; connection points for said main exhaust pipe and the first bypass pipe are formed thereby;

a second bypass pipe having a length which is variable and connected to said main exhaust pipe at both ends thereof so that a second bypass section is defined in the passage of said main exhaust pipe;

first and second actuators adapted to be actuated to vary the length of said first and second bypass pipes, respectively; and a controller for controlling said first and second actuators wherein said apparatus comprises a dual mode type muffler which is installed downstream of the main exhaust pipe and is controlled by the controller so as to be selectively actuated to function as one of a higher back pressure muffler and a lower back pressure muffler.

18. An apparatus for controlling exhaust noise from an internal combustion engine, comprising:

a main exhaust pipe;

a first bypass pipe having a length which is variable and connected to said main exhaust pipe at both ends thereof so that a first bypass section is defined in the passage of said main exhaust pipe;

a second bypass pipe having a length which is variable and connected to said main exhaust pipe at both ends thereof so that a second bypass section is defined in the passage of said main exhaust pipe;

first and second actuators adapted to be actuated to vary the length of said first and second bypass pipes, respectively;

wherein said apparatus comprises a double mode type muffler which is installed downstream of the main exhaust pipe and is selectively actuated as one of a high back pressure muffler and a low back pressure muffler in accordance with the exhaust gas pressure.

19. An apparatus for controlling exhaust noise from an internal combustion engine, comprising:

a main exhaust pipe;

a first bypass pipe having a length which is variable and connected to said main exhaust pipe at both ends thereof so that a first bypass section is defined in a passage of said main exhaust pipe;

a second bypass pipe having a length which is variable and connected to said main exhaust pipe at both ends thereof so that a second bypass section is defined in the passage of said main exhaust pipe;

first and second actuators adapted to be actuated to vary the length of said first and second bypass pipes, respectively; and a controller for controlling said first and second actuators;

wherein said apparatus further comprises a second exhaust pipe bifurcated upstream of the first bypass pipe from the main exhaust pipe, and a valve for selectively communicating two exhaust gas passages defined by the main exhaust pipe and the second exhaust pipe, and wherein said valve is controlled by the controller.

* * * * *